(12) United States Patent  (10) Patent No.: US 7,593,228 B2
Jarrett et al.  (45) Date of Patent: Sep. 22, 2009

(54) TECHNIQUE FOR FORMING A THERMALLY CONDUCTIVE INTERFACE WITH PATTERNED METAL FOIL

(75) Inventors: Robert N. Jarrett, Clinton, NY (US); Craig K. Merritt, Remsen, NY (US)

(73) Assignee: Indium Corporation of America, Utica, NY (US)

( * ) Notice: Subject to any disclaimer, the term of this patent is extended or adjusted under 35 U.S.C. 154(b) by 138 days.

(21) Appl. No.: 11/552,908

(22) Filed: Oct. 25, 2006

(65) Prior Publication Data

US 2007/0091574 A1 Apr. 26, 2007

Related U.S. Application Data

(60) Provisional application No. 60/730,026, filed on Oct. 26, 2005.

(51) Int. Cl.
*H05K 7/20* (2006.01)
*F28F 7/00* (2006.01)
*H01L 23/34* (2006.01)

(52) U.S. Cl. .............. 361/704; 165/80.2; 165/80.3; 165/185; 257/713; 257/719; 257/707; 361/708; 361/710; 361/718; 361/722

(58) Field of Classification Search ............ None
See application file for complete search history.

(56) References Cited

U.S. PATENT DOCUMENTS

| | | | |
|---|---|---|---|
| 3,261,396 A | | 7/1966 | Trunk |
| 3,694,699 A | * | 9/1972 | Snyder et al. ............ 361/705 |
| 4,151,547 A | | 4/1979 | Rhoades et al. |
| 4,654,754 A | * | 3/1987 | Daszkowski ............. 361/708 |
| 4,685,606 A | | 8/1987 | Flint et al. |
| 4,838,347 A | * | 6/1989 | Dentini et al. ............ 165/185 |
| 4,926,935 A | * | 5/1990 | Haushalter ............... 165/185 |
| 5,268,813 A | | 12/1993 | Chapman |
| 5,291,371 A | | 3/1994 | Gruber et al. |
| 5,438,477 A | | 8/1995 | Pasch |
| 5,528,456 A | * | 6/1996 | Takahashi ................ 361/704 |
| 5,545,473 A | * | 8/1996 | Ameen et al. ............ 428/212 |
| 5,566,051 A | * | 10/1996 | Burns ..................... 361/704 |

(Continued)

OTHER PUBLICATIONS

E. Samson, et al., "Interface Material Selection and a Thermal Management Technique in Second-Generation Platforms Built on Intel® Centrino™ Mobile Technology", Intel Technology Journal, http://www.intel.com/technology.itj/2005/volumne09issue01/art06_interface_materials/p01_abstract.htm, Feb. 2005.

(Continued)

*Primary Examiner*—Gregory D Thompson
(74) *Attorney, Agent, or Firm*—Sheppard Mulling Richter & Hampton LLP

(57) ABSTRACT

A technique for forming a thermally conductive interface with patterned metal foil is disclosed. In one particular exemplary embodiment, the technique may be realized as a thermally conductive metal foil having at least one patterned surface for facilitating heat dissipation from at least one integrated circuit device to at least one heat sink. The metal foil preferably has a characteristic formability and softness that may be exemplified by alloys of lead, indium, tin, and other malleable metals, and/or composites comprising layers of at least one malleable metal alloy.

20 Claims, 9 Drawing Sheets

U.S. PATENT DOCUMENTS

| | | |
|---|---|---|
| 5,757,073 A | 5/1998 | Hoffmeyer |
| 5,918,665 A * | 7/1999 | Babcock et al. ........ 165/104.33 |
| 6,000,603 A | 12/1999 | Koskenmaki et al. |
| 6,031,727 A | 2/2000 | Duesman et al. |
| 6,054,198 A * | 4/2000 | Bunyan et al. ............. 428/40.5 |
| 6,131,646 A * | 10/2000 | Kelley ....................... 165/80.1 |
| 6,411,513 B1 | 6/2002 | Bedard |
| 6,495,924 B2 * | 12/2002 | Kodama et al. ............. 257/785 |
| 6,542,371 B1 * | 4/2003 | Webb ......................... 361/708 |
| 6,644,395 B1 | 11/2003 | Bergin |
| 6,867,978 B2 | 3/2005 | Whittenburg et al. |
| 6,901,997 B2 | 6/2005 | Rauch |
| 6,940,721 B2 | 9/2005 | McCullough |
| 6,950,195 B2 * | 9/2005 | Endo et al. .................. 356/520 |
| 7,004,244 B2 | 2/2006 | Rauch |
| 7,200,006 B2 * | 4/2007 | Farrow et al. ................ 361/704 |
| 7,269,015 B2 * | 9/2007 | Hornung et al. ............. 361/704 |
| 2001/0016985 A1 | 8/2001 | Insley et al. |
| 2002/0015288 A1 * | 2/2002 | Dibene et al. ................ 361/711 |
| 2003/0127727 A1 | 7/2003 | Suehiro et al. |
| 2003/0151898 A1 | 8/2003 | Tetsuka et al. |
| 2005/0061474 A1 * | 3/2005 | Gelorme et al. ............ 165/80.2 |
| 2005/0211752 A1 | 9/2005 | Hurley et al. |

OTHER PUBLICATIONS

CPU Thermal Management, Advanced Micro Devices Application Note, #18448 Rev D, Aug. 1995.

* cited by examiner

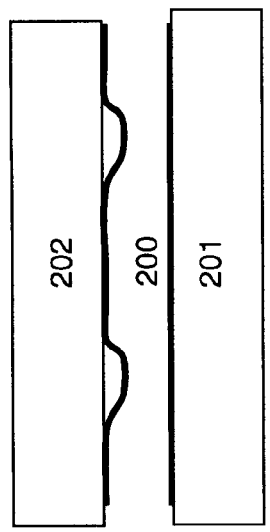
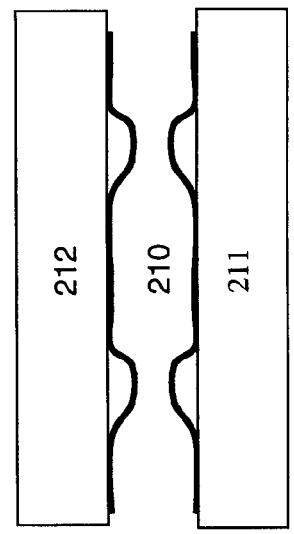
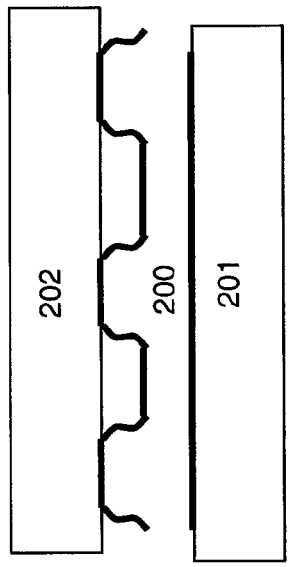
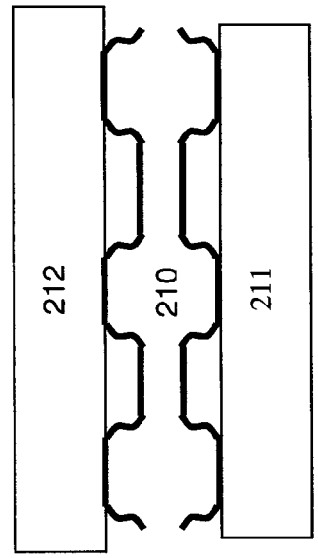
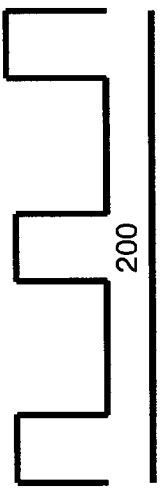
Figure 2(a)
Figure 2(b)

301

302

303

304

305

306

TECHNIQUE FOR FORMING A THERMALLY CONDUCTIVE INTERFACE WITH PATTERNED METAL FOIL

CROSS-REFERENCE TO RELATED APPLICATIONS

This patent application claims priority to U.S. Provisional Patent Application No. 60/730,026, filed Oct. 26, 2005, which is hereby incorporated by reference herein in its entirety.

FIELD OF THE DISCLOSURE

The present disclosure relates generally to thermal conductivity and, more particularly, to a technique for forming a thermally conductive interface with patterned metal foil.

BACKGROUND OF THE DISCLOSURE

As the electronics industry continues to evolve, the density of electronic devices continues to increase. That is, more and more circuits are being included on integrated circuit devices without a corresponding increase in device size. Such integrated circuit devices generate substantial amounts of heat during operation. Thus, due to increases in circuit density, integrated circuit devices are requiring corresponding increases in heat dissipation to ensure device performance and system reliability.

For example, a copper heat sink may be mechanically clamped down on a microprocessor chip of an integrated circuit (IC) device. The heat sink may be directly or remotely cooled. To ensure better heat transfer from the microprocessor chip to the heat sink, a thermally conductive interface layer has traditionally been applied. Traditional thermally conductive interface layers have included polymer greases and gels, and metal reflow solders.

Polymer greases and gels suffer from a limitation of low thermal conductivity. Additionally, such polymers degrade with temperature and thermal cycling which results in diminished properties during the operating life. Metal reflow solders entail relatively difficult manufacturing and rework processes adding cost.

More advanced interface materials used to overcome some of above-described shortcomings of traditional thermally conductive interface layers include phase-change materials (PCMs) and low melting alloys (LMAs). PCMs are typically stable in an interface between an integrated circuit device and a heat sink, but are thicker than other polymer materials. This thickness results in poor thermal performance. LMAs provide superior thermal conductivity by forming continuous liquid metal films in an interface between an integrated circuit device and a heat sink at operating temperatures. However, oxidation products of all suitable LMAs degrade performance in service.

Metal foils have previously been tested for use as thermal interface materials, but such foils have not performed reliably in this application. Specifically, metal foils have not conformed well enough to surface irregularities and deviations from co-planarity, thereby resulting in unacceptable temperature distributions on integrated circuit devices.

In view of the foregoing, it would be desirable to provide a technique for increasing heat dissipation from integrated circuit devices which overcomes the above-described inadequacies and shortcomings.

SUMMARY OF THE DISCLOSURE

A technique for forming a thermally conductive interface with patterned metal foil is disclosed. In one particular exemplary embodiment, the technique may be realized as a thermally conductive metal foil having at least one patterned surface for facilitating heat dissipation from at least one integrated circuit device to at least one heat sink. The metal foil preferably has a characteristic formability and softness that may be exemplified by alloys of lead, indium, tin, and other malleable metals, and/or composites comprising layers of at least one malleable metal alloy.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2(a) shows cross-sectional views of a single-sided thermally conductive metal foil being sandwiched between an integrated circuit device and a heat sink in accordance with an embodiment of the present disclosure.

FIG. 2(b) shows cross-sectional views of a double-sided thermally conductive metal foil being sandwiched between an integrated circuit device and a heat sink in accordance with an embodiment of the present disclosure.

DETAILED DESCRIPTION OF EXEMPLARY EMBODIMENTS

Figure 1A:
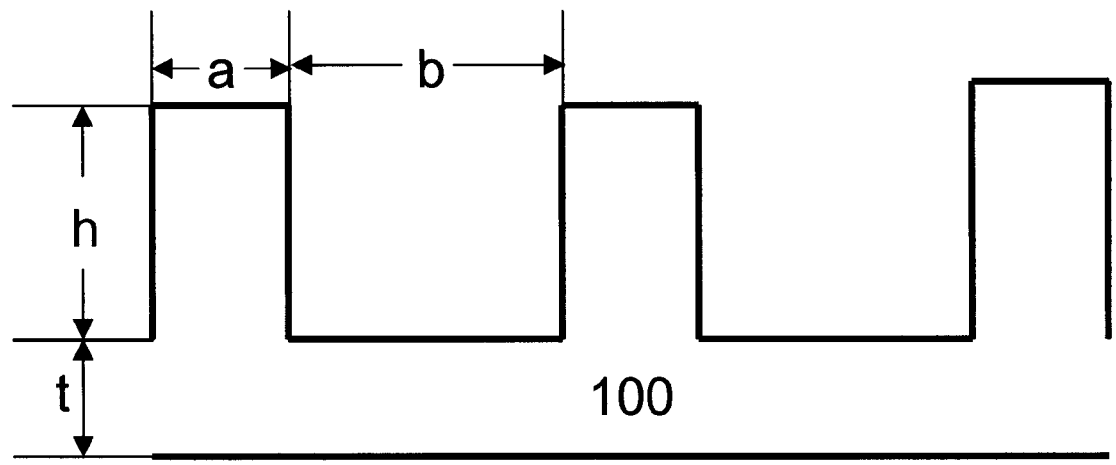
FIG. 1(a) shows a cross-sectional view of a single-sided thermally conductive metal foil which may be used as a thermally conductive interface layer between an integrated circuit device and a heat sink in accordance with an embodiment of the present disclosure.

Referring to FIG. 1(a), there is shown a cross-sectional view of a single-sided thermally conductive metal foil 100 which may be used as a thermally conductive interface layer between an integrated circuit device and a heat sink in accordance with an embodiment of the present disclosure. The metal foil 100 is fabricated to have a surface texture which markedly alters the thickness of sections of the metal foil 100 to produce a pattern of peaks and valleys, which may be characterized by height (h) of peaks, width of peaks (a), width of valleys (b), and thickness (t) of base material. The pattern may be generated by roll forming or pressing the metal foil 100, but the pattern may also be generated by other chemical or physical methods. For illustration purposes, FIG. 1(a) shows the metal foil 100 as having a pattern that is simplified and regular. However, in application, the pattern may be uniform or random, and may be linear or a two-dimensional projection with equivalent response. The metal foil 100 preferably has a characteristic formability and softness that may be exemplified by alloys of lead, indium, tin, and other malleable metals, and/or composites comprising layers of at least one malleable metal alloy. For example, the metal foil 100 may be formed entirely of an alloy of a metal such as, for example, lead. Alternatively, the metal foil 100 may be formed of a composite comprising one or more layers including at least one such metal alloy. In such a composite, the layers need not be formed of the same metal alloy, but may be tailored with other alloys or materials to provide specific thermal or mechanical properties to the composite.

Figure 1B:
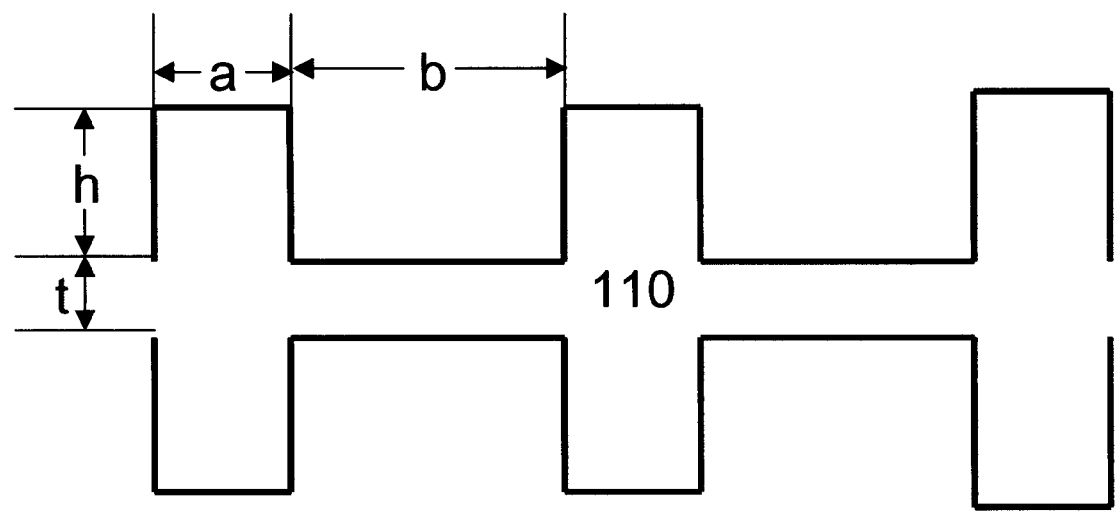
FIG. 1(b) shows a cross-sectional view of a double-sided thermally conductive metal foil which may be used as a thermally conductive interface layer between an integrated circuit device and a heat sink in accordance with an embodiment of the present disclosure.

Referring to FIG. 1(b), there is shown a cross-sectional view of a double-sided thermally conductive metal foil 110 which may be used as a thermally conductive interface layer between an integrated circuit device and a heat sink in accordance with an embodiment of the present disclosure. The metal foil 110 may have the same characteristics of the metal foil 100 discussed above.

Referring to FIG. 2(a), there are shown cross-sectional views of a single-sided thermally conductive metal foil 200 being sandwiched between an integrated circuit device 201 and a heat sink 202 in accordance with an embodiment of the present disclosure. The heat sink 202 is typically mechanically clamped to the integrated circuit device 201. However, other attachment means are also possible. In any event, the pressure associated with attaching the heat sink 202 to the integrated circuit device 201 results in a deformation of the patterned surface of the metal foil 200 so that it adapts to irregularities in a contact surface of the heat sink 202. These irregularities may be from imperfections in a contact surface of the heat sink 202, or from discrepancies in planarity between contact surfaces of the heat sink 202 and the integrated circuit device 201. Of course, irregularities may also be present in a contact surface of the integrated circuit device 201, in which case the metal foil 200 may be flipped so that the patterned surface thereof is deformed and adapts to irregularities in the contact surface of the integrated circuit device 201.

At this point it should be noted that it is within the scope of the present disclosure that the metal foil 200 may be sandwiched between single or multiple integrated circuit devices 201 and/or heat sinks 202, wherein the metal foil 200 may also accommodate differences in elevation of the single or multiple integrated circuit devices 201 and/or heat sinks 202.

Referring to FIG. 2(b), there are shown cross-sectional views of a double-sided thermally conductive metal foil 210 being sandwiched between an integrated circuit device 211 and a heat sink 212 in accordance with an embodiment of the present disclosure. The metal foil 210 may have the same characteristics and applications of the metal foil 200 discussed above.

Figure 3A:
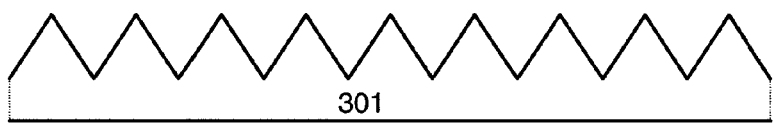
FIG. 3(a) shows cross-sectional views of multiple examples of single-sided thermally conductive metal foils having different types of uniform patterned surfaces in accordance with embodiments of the present disclosure.
Figure 3A:
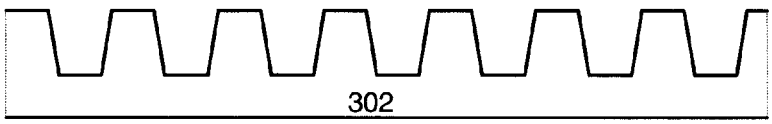
Figure 3A:
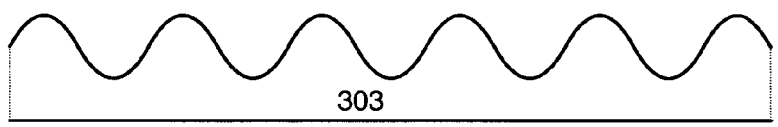

Referring to FIG. 3(a), there are shown cross-sectional views of multiple examples of single-sided thermally conductive metal foils having different types of uniform patterned surfaces in accordance with embodiments of the present disclosure. The examples include a metal foil 301 having a uniform saw tooth patterned surface, a metal foil 302 having a uniform square wave patterned surface, and a metal foil 303 having a uniform sinusoidal patterned surface. Of course, other examples of single-sided thermally conductive metal foils having different types of uniform patterned surfaces are also possible in accordance with additional embodiments of the present disclosure.

Figure 3B:
FIG. 3(b) shows cross-sectional views of multiple examples of double-sided thermally conductive metal foils having different types of uniform patterned surfaces in accordance with embodiments of the present disclosure.
Figure 3B:
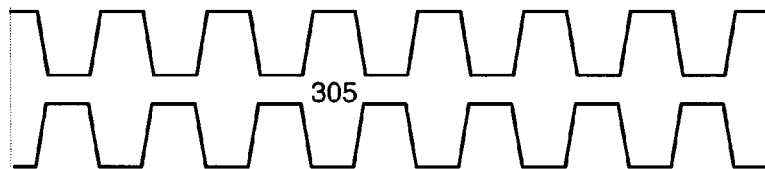
Figure 3B:
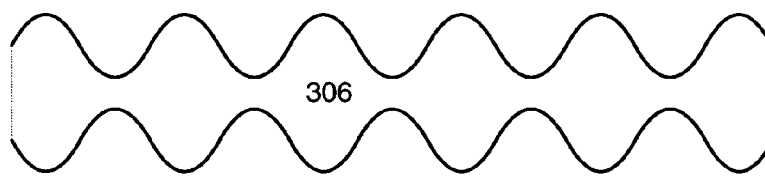
Figure 9:
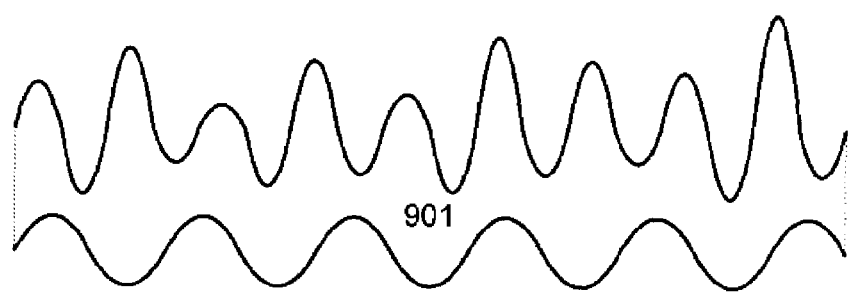
FIG. 9 shows a cross-sectional view of an example of a double-sided thermally conductive metal foil having uniform and non-uniform patterned surfaces in accordance with an embodiment of the present disclosure.

Referring to FIG. 3(b), there are shown cross-sectional views of multiple examples of double-sided thermally conductive metal foils having different types of uniform patterned surfaces in accordance with embodiments of the present disclosure. The examples include a metal foil 304 having uniform saw tooth patterned surfaces, a metal foil 305 having uniform square wave patterned surfaces, and a metal foil 306 having uniform sinusoidal patterned surfaces. Of course, other examples of double-sided thermally conductive metal foils having different types of uniform patterned surfaces are also possible in accordance with additional embodiments of the present disclosure. Also, double-sided thermally conductive metal foils having different types of uniform and non-uniform patterned surfaces on opposing surfaces are also possible in accordance with additional embodiments of the present disclosure (e.g., see metal foil 901 in FIG. 9).

Figure 4A:
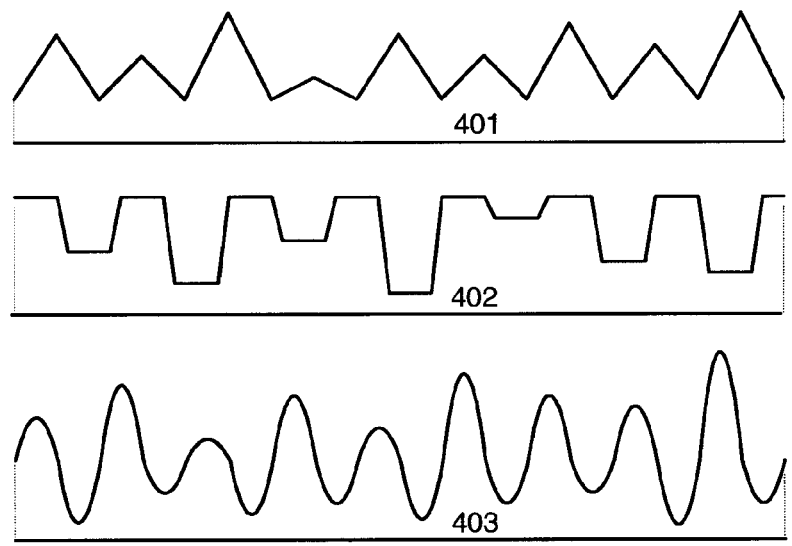
FIG. 4(a) shows cross-sectional views of multiple examples of single-sided thermally conductive metal foils having different types of non-uniform patterned surfaces in accordance with embodiments of the present disclosure.

Referring to FIG. 4(a), there are shown cross-sectional views of multiple examples of single-sided thermally conductive metal foils having different types of non-uniform patterned surfaces in accordance with embodiments of the present disclosure. The examples include a metal foil 401 having a non-uniform saw tooth patterned surface, a metal foil 402 having a non-uniform square wave patterned surface, and a metal foil 403 having a non-uniform sinusoidal patterned surface. Of course, other examples of single-sided thermally conductive metal foils having different types of non-uniform patterned surfaces are also possible in accordance with additional embodiments of the present disclosure.

Figure 4B:
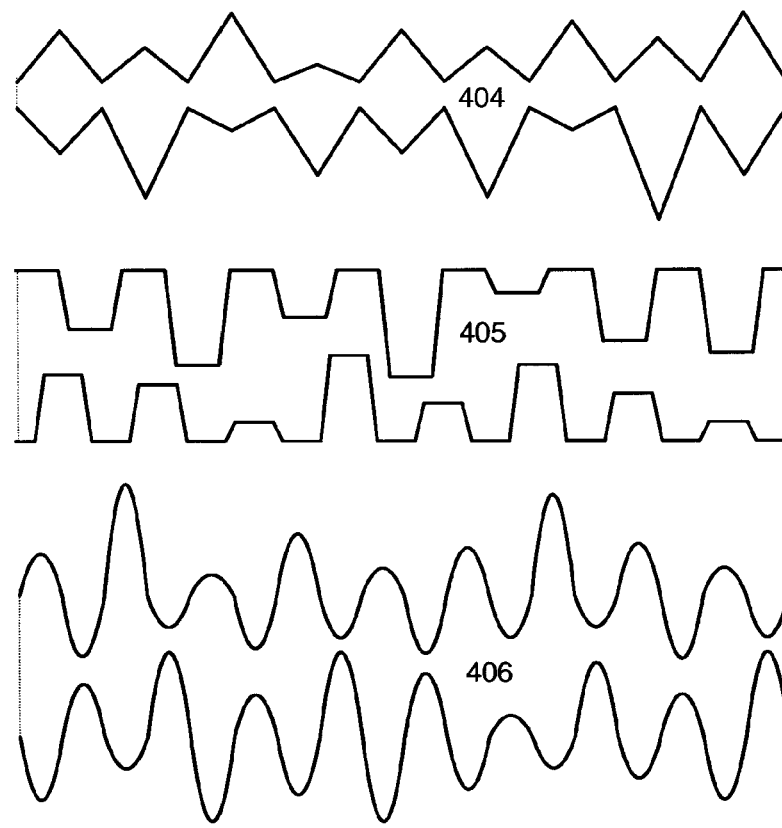
FIG. 4(b) shows cross-sectional views of multiple examples of double-sided thermally conductive metal foils having different types of non-uniform patterned surfaces in accordance with embodiments of the present disclosure.

Referring to FIG. 4(b), there are shown cross-sectional views of multiple examples of double-sided thermally conductive metal foils having different types of non-uniform patterned surfaces in accordance with embodiments of the present disclosure. The examples include a metal foil 404 having a non-uniform saw tooth patterned surface, a metal foil 405 having a non-uniform square wave patterned surface, and a metal foil 406 having a non-uniform sinusoidal patterned surface. Of course, other examples of double-sided thermally conductive metal foils having different types of non-uniform patterned surfaces are also possible in accordance with additional embodiments of the present disclosure. Also, double-sided thermally conductive metal foils having different types of uniform and non-uniform patterned surfaces on opposing surfaces are also possible in accordance with additional embodiments of the present disclosure (e.g., see metal foil 901 in FIG. 9).

Figure 5:
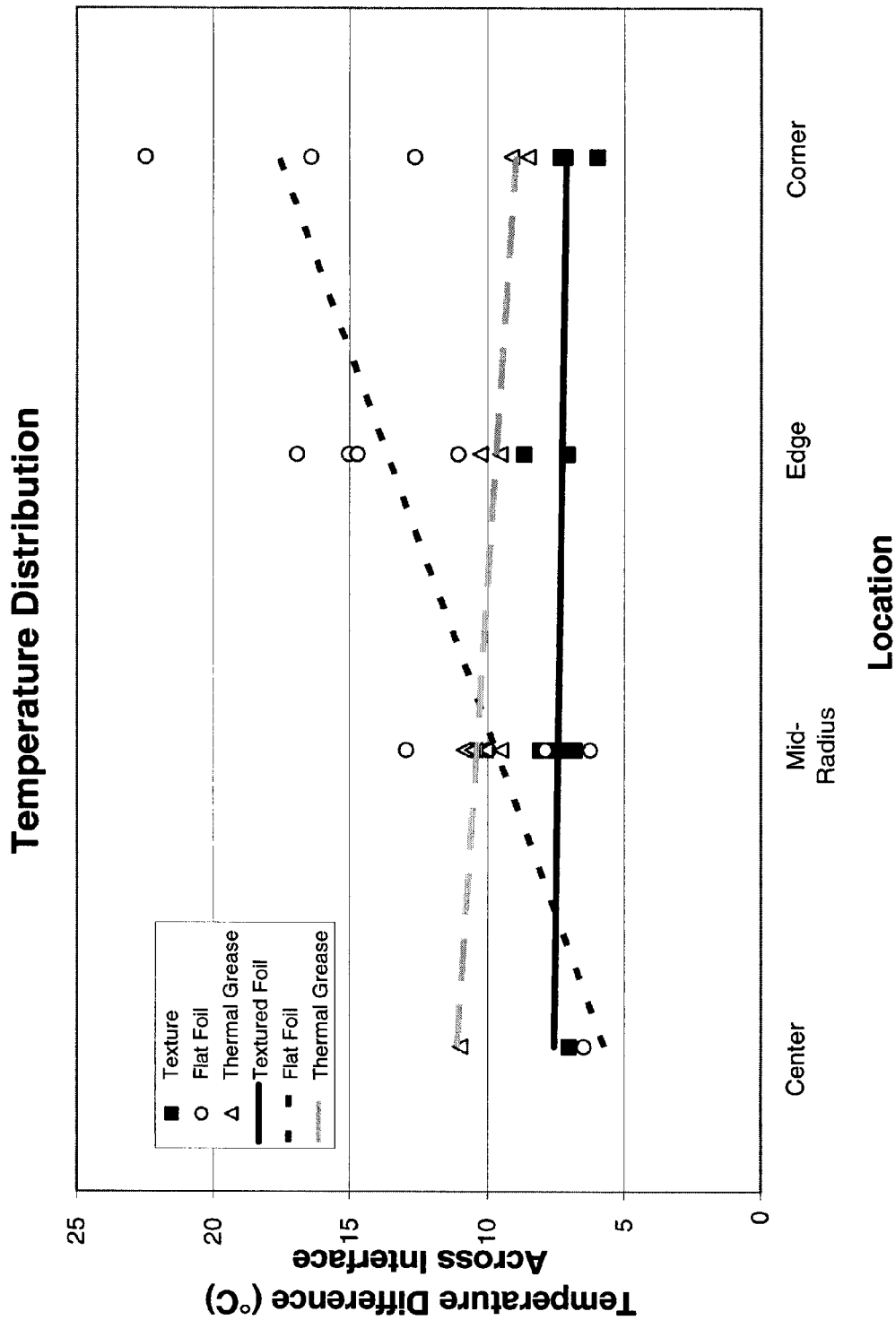
FIG. 5 shows a graph of temperature differences across an interface between a heat sink and an integrated circuit device for a flat metal foil, a thermal grease, and a patterned thermally conductive metal foil in accordance an embodiment of the present disclosure.

Referring to FIG. 5, there is shown a graph of temperature differences across an interface between a heat sink and an integrated circuit device for a flat metal foil, a thermal grease, and a patterned thermally conductive metal foil in accordance an embodiment of the present disclosure. As shown in FIG. 5, the use of a patterned thermally conductive metal foil can markedly improve temperature uniformity and heat removal in comparison to a flat metal foil and a thermal grease. Significantly, the patterned thermally conductive metal foil need not be melted in a solder reflow operation. While the uniformity of the temperature difference is comparable between the patterned thermally conductive metal foil and the thermal grease, the magnitude of temperature difference is significantly lower for the patterned thermally conductive metal foil due to a higher thermal conductivity of metal foil compared to thermal grease.

Figure 6:
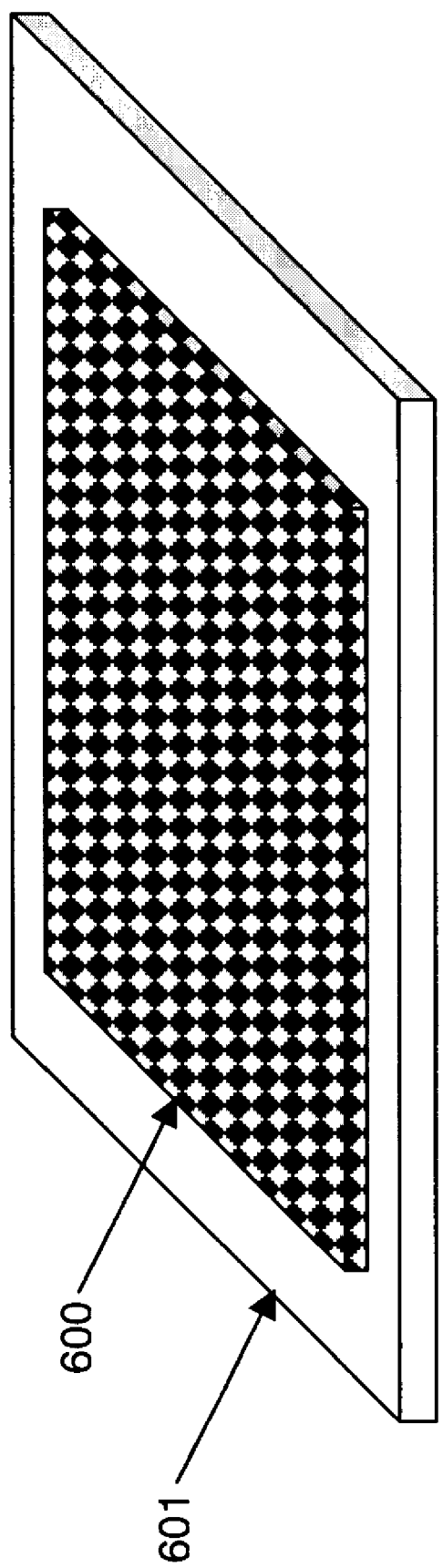
FIG. 6 shows a perspective view of a patterned metal foil attached to a support frame in accordance with an embodiment of the present disclosure.

Referring to FIG. 6, there is shown a perspective view of a patterned metal foil 600 attached to a support frame 601 in accordance with an embodiment of the present disclosure. The patterned metal foil 600 may be attached to the support frame 601 by several means such as, for example, an adhesive such as contact cement or double-sided tape. The support frame 601 may be fabricated from rigid or flexible materials, or composites of both of such types of materials. For example, the support frame 601 may be fabricated of card stock or plastic to provide sufficient structure to handle the patterned metal foil 600 during transportation or assembly. Also, the support frame 601 may be fabricated of a flexible or compliant material such as foam or rubber to provide isolation from vibration.

Figure 7:
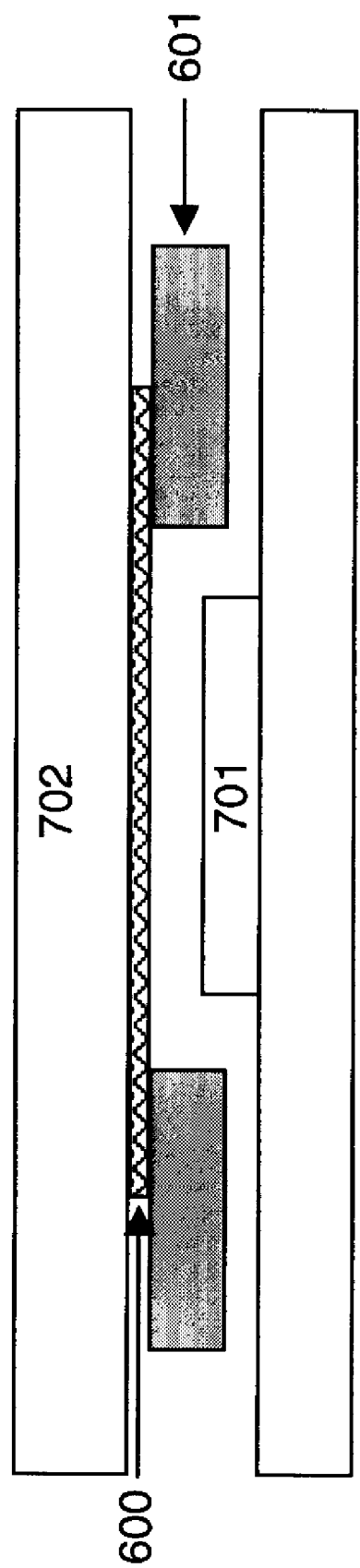
FIG. 7 shows a cross-sectional view of a patterned metal foil attached to a support frame.
Figure 8:
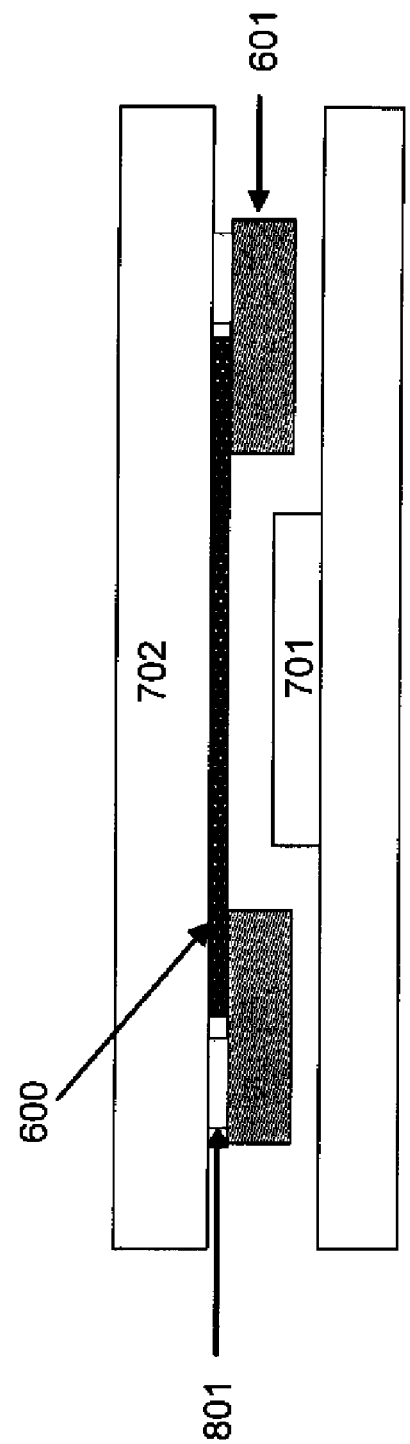
FIG. 8 shows a perspective view of a patterned metal foil attached to a support frame in accordance with an alternative embodiment of the present disclosure.

Referring to FIG. 7, there is shown a cross-sectional view of the patterned metal foil 600 and the support frame 601 positioned between an integrated circuit device 701 and a heat sink 702 before the integrated circuit device 701 and the heat sink 702 are clamped together. In this configuration, the support frame 601 protects the patterned metal foil 600 against damage when clamping the integrated circuit device 701 to the heat sink 702. In an alternative embodiment, as shown in FIG. 8, an adhesive 801 may be placed on a surface of the support frame 601 so as to allow the patterned metal foil 600 and the support frame 601 to be attached to the heat sink 702 in a pre-assembly. That is, the adhesive 801 may be used to attach the support frame 601 (and hence the patterned metal foil 600 by virtue of its attachment to the support frame 601) to the heat sink 702 before the heat sink 702 is clamped to the integrated circuit device 701.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the application is not limited to direct contact with integrated circuit devices, but has general application to the conduction of heat across a thermal interface such as between a heat spreader surface and its heat sink. Additional variations of the present disclosure may be readily applied to other fields such as power radio frequency (RF) devices, power light-emitting diodes (LEDs), photonics, and other applications requiring the transfer of heat across a contact surface. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. That is, those of ordinary skill in the art having access to the teachings herein will recognize additional implementations, modifications, and embodiments, as well as other fields of use, which are within the scope of the present disclosure as described herein, and with respect to which the present disclosure may be of significant utility.

The invention claimed is:

1. A thermally conductive metal foil having a unitary structure of non-uniform thickness, the foil comprising a plurality of first regions and a plurality of second regions, the first regions having a first thickness and the second regions having a second thickness greater than the first thickness and forming a patterned surface on the thermally conductive metal foil, the thermally conductive metal foil configured to facilitate heat dissipation from at least one integrated circuit device to at least one heat sink when disposed directly between and in direct contact with the at least one integrated circuit device and the at least one heat sink, the thermally conductive metal foil being formed of a material that is deformable and adaptable to irregularities, thereby conforming to shapes of such irregularities, in at least one contact surface of at least one of the at least one integrated circuit device and the at least one heat sink, the thermally conductive metal foil being formed with an alloy comprising indium.

2. The thermally conductive metal foil of claim 1, wherein the at least one patterned surface comprises one patterned surface, wherein the thermally conductive metal foil further comprises an unpatterned surface opposing the one patterned surface.

3. The thermally conductive metal foil of claim 2, wherein the one patterned surface is a uniform patterned surface.

4. The thermally conductive metal foil of claim 2, wherein the one patterned surface is a non-uniform patterned surface.

5. The thermally conductive metal foil of claim 1, wherein the at least one patterned surface comprises two opposing patterned surfaces.

6. The thermally conductive metal foil of claim 5, wherein the two opposing patterned surfaces are uniform patterned surfaces.

7. The thermally conductive metal foil of claim 5, wherein the two opposing patterned surfaces are non-uniform patterned surfaces.

8. The thermally conductive metal foil of claim 5, wherein the two opposing patterned surfaces comprise a uniform patterned surface and a non-uniform patterned surface.

9. The thermally conductive metal foil of claim 1, wherein the at least one patterned surface deforms and adapts to irregularities, thereby conforming to shapes of such irregularities, in the at least one contact surface of at least one of the at least one integrated circuit device and at least one heat sink when the at least one integrated circuit device and the at least one heat sink are forced together.

10. The thermally conductive metal foil of claim 1, wherein the thermally conductive metal foil is formed of a composite comprising one or more layers, wherein at least one of the layers comprises the alloy.

11. The thermally conductive metal foil of claim 1, wherein the thermally conductive metal foil is formed of a composite comprising one or more layers, wherein, each of the layers comprises the alloy.

12. The thermally conductive metal foil of claim 1, wherein the first regions have a substantially uniform thickness and the patterned surface comprises a plurality of peaks extending beyond one side of the first regions to form the patterned surface and one opposing unpatterned surface.

13. The thermally conductive metal foil of claim 1, wherein the first regions have a substantially uniform thickness and the patterned surface comprises a plurality of peaks extending outward from two sides of the first regions to form two structurally patterned surfaces.

14. A thermally conductive metal foil assembly comprising:
   a support frame; and
   a thermally conductive metal foil attached to and supported by the support frame, the thermally conductive metal foil having a unitary structure of non-uniform thickness, the foil comprising a plurality of first regions and a plurality of second regions, the first regions having a first thickness and the second regions having a second thickness greater than the first thickness and forming a patterned surface on the thermally conductive metal foil, the thermally conductive metal foil configured to facilitate heat dissipation from at least one integrated circuit device to at least one heat sink when disposed directly between and in direct contact with the at least one integrated circuit device and the at least one heat sink, the thermally conductive metal foil being formed of a material that is deformable and adaptable to irregularities, thereby conforming to shapes of such irregularities, in at least one contact surface of at least one of the at least one integrated circuit device and the at least one heat sink, the thermally conductive metal foil being formed with an alloy comprising indium.

15. The thermally conductive metal foil assembly of claim 14, wherein the support frame comprises adhesive on at least one surface thereof for facilitating attachment of the support frame to the at least one heat sink.

16. The thermally conductive metal foil assembly of claim 14, wherein the thermally conductive metal foil is formed of a composite comprising one or more layers, wherein at least one of the layers comprises the alloy.

17. The thermally conductive metal foil assembly of claim 14, wherein the thermally conductive metal foil is formed of a composite comprising one or more layers, wherein each of the layers comprises the alloy.

18. The thermally conductive interface system of claim 14, wherein the thermally conductive metal foil is formed of a composite comprising one or more layers, wherein at least one of the layers comprises the alloy.

19. The thermally conductive interface system of claim 14, wherein the thermally conductive metal foil is formed of a composite comprising one or more layers, wherein each of the layers comprises the alloy.

20. A thermally conductive interface system comprising:
   at least one integrated circuit device;
   at least one heat sink; and
   a thermally conductive metal foil having a unitary structure of non-uniform thickness, the foil comprising a plurality of first regions and a plurality of second regions, the first regions having a first thickness and the second regions having a second thickness greater than the first thickness and forming a patterned surface on the thermally conductive metal foil, the thermally conductive metal foil disposed directly between and in direct contact with the at least one integrated circuit device and the at least one heat sink to facilitate heat dissipation from the at least one integrated circuit device to the at least one heat sink, the thermally conductive metal foil being formed of a material that is deformable and adaptable to irregularities, thereby conforming to shapes of such irregularities, in at least one contact surface of at least one of the at least one integrated circuit device and the at least one heat sink, the thermally conductive metal foil being formed with an alloy comprising indium.

* * * * *